(12) United States Patent
Ito et al.

(10) Patent No.: US 9,930,778 B2
(45) Date of Patent: Mar. 27, 2018

(54) CONNECTION STRUCTURE OF WIRING SUBSTRATE, AND CONNECTION METHOD OF WIRING SUBSTRATE

(71) Applicant: ALPS ELECTRIC CO., LTD., Tokyo (JP)

(72) Inventors: Takayuki Ito, Miyagi-ken (JP); Masashi Tabata, Miyagi-ken (JP); Yu Watanabe, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 195 days.

(21) Appl. No.: 15/018,756

(22) Filed: Feb. 8, 2016

(65) Prior Publication Data

US 2016/0270224 A1 Sep. 15, 2016

(30) Foreign Application Priority Data

Mar. 9, 2015 (JP) ................. 2015-045718

(51) Int. Cl.
| | |
|---|---|
| *H05K 1/11* | (2006.01) |
| *H05K 1/14* | (2006.01) |
| *H05K 1/02* | (2006.01) |
| *H05K 1/18* | (2006.01) |

(52) U.S. Cl.
CPC ............. *H05K 1/11* (2013.01); *H05K 1/028* (2013.01); *H05K 1/14* (2013.01); *H05K 1/18* (2013.01)

(58) Field of Classification Search
CPC ........ H05K 3/361; H05K 1/111–1/118; H05K 1/028; H01L 21/4839
USPC .................. 174/254–264; 361/767, 772–774
See application file for complete search history.

(56) References Cited

U.S. PATENT DOCUMENTS

| | | | | |
|---|---|---|---|---|
| 5,706,174 | A * | 1/1998 | Distefano | H01L 21/4839 174/254 |
| 6,486,408 | B1 * | 11/2002 | Morris | H05K 1/116 174/251 |
| 7,417,195 | B2 * | 8/2008 | Totani | H05K 3/361 174/254 |
| 2009/0302109 | A1 * | 12/2009 | Kerner | G06K 7/0013 235/439 |
| 2011/0128325 | A1 * | 6/2011 | Chen | H05K 3/244 347/50 |
| 2011/0132642 | A1 * | 6/2011 | Shinoda | H05K 1/028 174/254 |
| 2015/0003083 | A1 * | 1/2015 | Uehara | F21S 48/212 362/418 |

FOREIGN PATENT DOCUMENTS

JP 2014-96531 5/2014

* cited by examiner

*Primary Examiner* — Tuan T Dinh
(74) *Attorney, Agent, or Firm* — Beyer Law Group LLP

(57) ABSTRACT

Through positioning between a first mark portion of a first substrate body and a second mark portion of a second substrate body, a first connection terminal portion and a second connection terminal portion are superimposed on each other simultaneously with the superimposition of the second substrate body on the first substrate body. In addition, a first substrate cut-off portion and a second substrate cut-off portion are also superimposed on each other. The first connection terminal portion of a first row and the second connection terminal portion of the first row are electrically bonded to each other by thermo-compression bonding or the like.

5 Claims, 6 Drawing Sheets

CONNECTION STRUCTURE OF WIRING SUBSTRATE, AND CONNECTION METHOD OF WIRING SUBSTRATE

CLAIM OF PRIORITY

This application claims benefit of Japanese Patent Application No. 2015-045718 filed on Mar. 9, 2015, which is hereby incorporated by reference.

BACKGROUND OF THE INVENTION

1. Field of the Invention

The present invention relates to a wiring substrate having circuit components or the like mounted therein, a connection structure of wiring substrates, and a method of connecting wiring substrates, and particularly relates to wiring substrates electrically connected to each other by superimposition, a connection structure of wiring substrates, and a method of connecting wiring substrates.

2. Description of the Related Art

Hitherto, electronic circuit devices have been known in which two printed wiring substrates having electronic circuit components mounted therein are superimposed on each other, and connection terminals of each printed wiring substrate are electrically bonded to each other.

Incidentally, in the electronic circuit devices, when it is confirmed whether the operation of electronic circuit components mounted in each printed wiring substrate is normal, connection terminals of each printed wiring substrate are temporarily bonded to each other by thermo-compression bonding or a conductive adhesive, and the confirmation is performed. When the operation of the electronic circuit components is normal, temporary bonding of the connection terminals serves as main bonding as it is.

However, when the operation of the electronic circuit components is not normal and the electronic circuit components are required to be replaced, the thermo-compression bonding state of the bonding terminals is eliminated, or the conductive adhesive is peeled off, and thus the temporary bonding of the connection terminals is resolved. A method is taken in which each printed wiring substrate is returned to a state before the connection to replace the electronic circuit components with new ones, and then the connection terminals of the respective printed wiring substrates are reconnected to each other.

As described above, when a method is taken in which, after the connection terminals of two printed wiring substrates having electronic circuit components mounted therein are temporarily connected to each other, the connection state of the connection terminals is eliminated, and main connection of the connection terminals is performed again, the bonding strength of a compressed portion between the connection terminals becomes weaker, or the bonding state of the connection terminals becomes unstable due to the conductive adhesive remaining in the vicinity of the connection terminals, and thus it is difficult to obtain a stable electrical connection state between the respective connection terminals.

Such a problem is also present in a technique disclosed in the Japanese Unexamined Patent Application Publication No. 2014-96531. In Japanese Unexamined Patent Application Publication No. 2014-96531, an adhesive film is temporarily bonded onto a printed wiring substrate, the adhesive film is temporarily peeled off when a shift occurs at the attachment position of the adhesive film, and the adhesive film is bonded to the printed wiring substrate again after position adjustment.

Incidentally, when an electronic circuit component is required to be replaced in adjustment during temporary connection between connection terminals of a printed wiring substrate, it is also considered that an electronic circuit component operating normally is mounted in a new printed wiring substrate, and that the respective connection terminals are reconnected to each other. However, in such a connection method, replacement with a new printed wiring substrate is required to be performed, which leads to an increase in the cost of an electronic apparatus.

SUMMARY OF THE INVENTION

The present invention provides a wiring substrate, a connection structure of wiring substrates, and a method of connecting wiring substrates which are capable of reusing a wiring substrate and obtaining a stable electrical connection state between connection terminals even in the reuse.

In order to solve the above-mentioned problems of the related art, according to the present invention, there is provided a wiring substrate including: a substrate body; a wiring portion provided on the substrate body; a plurality of connection terminal portions provided in the wiring portion at intervals; and a substrate cut-off portion, provided at a position between the respective connection terminal portions of the substrate body, for cutting off electrical connection between the respective connection terminal portions.

According to such a configuration, even when a used connection terminal portion is cut off in the substrate body, it is possible to use an unused connection terminal portion, and to reuse the wiring substrate.

Preferably, the respective connection terminal portions are provided on one side on the substrate body, and a mounting region of circuit components is provided on the other side on the substrate body.

According to such a configuration, even when the substrate body is cut off, the mounting state of a circuit component to be mounted is not influenced.

According to the present invention, there is provided a connection structure of wiring substrates, including a first wiring substrate and a second wiring substrate. The first wiring substrate includes a first substrate body, a first wiring portion provided on the first substrate body, a plurality of first connection terminal portions provided in the first wiring portion at intervals, and a first substrate cut-off portion, provided between the respective first connection terminal portions of the first substrate body, for cutting off electrical connection between the respective first connection terminal portions. The second wiring substrate includes a second substrate body superimposed on the first substrate body, a plurality of second connection terminal portions provided in a second wiring portion provided in the second substrate body so as to be superimposed on the respective first connection terminal portions, respectively, and a second substrate cut-off portion, superimposed on the first substrate cut-off portion, for cutting off electrical connection between the respective second connection terminal portions. At least one of the respective first connection terminal portions and at least one the respective second connection terminal portions are electrically bonded to each other.

According to such a configuration, even after the superimposedly bonded connection terminal portion is cut off in the respective substrate bodies, it is possible to bond the respective connection terminal portions using each unused connection terminal portion, and to reuse each wiring substrate.

Preferably, the first connection terminal portion and the second connection terminal portion are electrically bonded to each other by compression.

According to such a configuration, the respective connection terminal portions can be electrically bonded to each other by compression, and thus it is possible to simply perform bonding between the respective connection terminal portions.

According to the present invention, there is provided a method of connecting wiring substrates, including a step of superimposing a first substrate body of a first wiring substrate on a second substrate body of a second wiring substrate, a step of superimposing a first connection terminal portion for bonding among a plurality of first connection terminal portions which are provided in a first wiring portion, at intervals, provided on the first substrate body, on a second connection terminal portion for bonding among a plurality of second connection terminal portions provided in the second wiring portion at intervals, a step of superimposing a first substrate cut-off portion, provided between the respective first connection terminal portions of the first substrate body, for cutting off electrical connection between the respective first connection terminal portions, on a second substrate cut-off portion, provided between the respective second connection terminal portions of the second substrate body, for cutting off electrical connection between the respective second connection terminal portions, a step of electrically bonding the first connection terminal portion and the second connection terminal portion which are superimposed in the step of superimposing the connection terminal portions, and a step of cutting off the respective substrate bodies in the respective substrate cut-off portions, separating the first connection terminal portion and the second connection terminal portion, bonded in the respective substrate bodies, from each other, and electrically bonding a first connection terminal portion and a second connection terminal portion which are not bonded to each other in the step of bonding the connection terminal portions.

According to such a method, even after a used connection terminal portion is cut off in the respective substrate bodies, it is possible to bond each unused connection terminal portion, and to reuse each wiring substrate.

Preferably, the first connection terminal portion and the second connection terminal portion are electrically bonded to each other by compression.

According to such a method, the respective connection terminal portions can be electrically bonded to each other by compression, and thus it is possible to simply perform bonding between the respective connection terminal portions.

Preferably, the above method further includes a step of providing a first mark portion at a corresponding position of the first substrate cut-off portion in the first substrate body, and providing a second mark portion at a corresponding position of the second substrate cut-off portion in the second substrate body, and a step of superimposing the respective first connection terminal portions on the respective second connection terminal portions by superimposing the respective mark portions, and superimposing the first substrate cut-off portion on the second substrate cut-off portion.

According to such a method, it is possible to use each mark portion provided in each of the substrate bodies in both the superimposition of the respective connection terminal portions and positioning between the respective substrate cut-off portions.

According to the present invention, it is possible to provide a wiring substrate, a connection structure of wiring substrates, and a method of connecting wiring substrates which are capable of reusing a wiring substrate and obtaining a stable electrical connection state between connection terminals even in the reuse.

DESCRIPTION OF THE PREFERRED EMBODIMENTS

Hereinafter, a flexible printed wiring substrate (hereinafter, referred to as an FPC) which is a wiring substrate according to an embodiment of the present invention will be described. Meanwhile, the present invention is applied to a rigid printed wiring substrate, and is also applied to a wiring substrate in which wirings are formed manually rather than by print.

Figure 1:
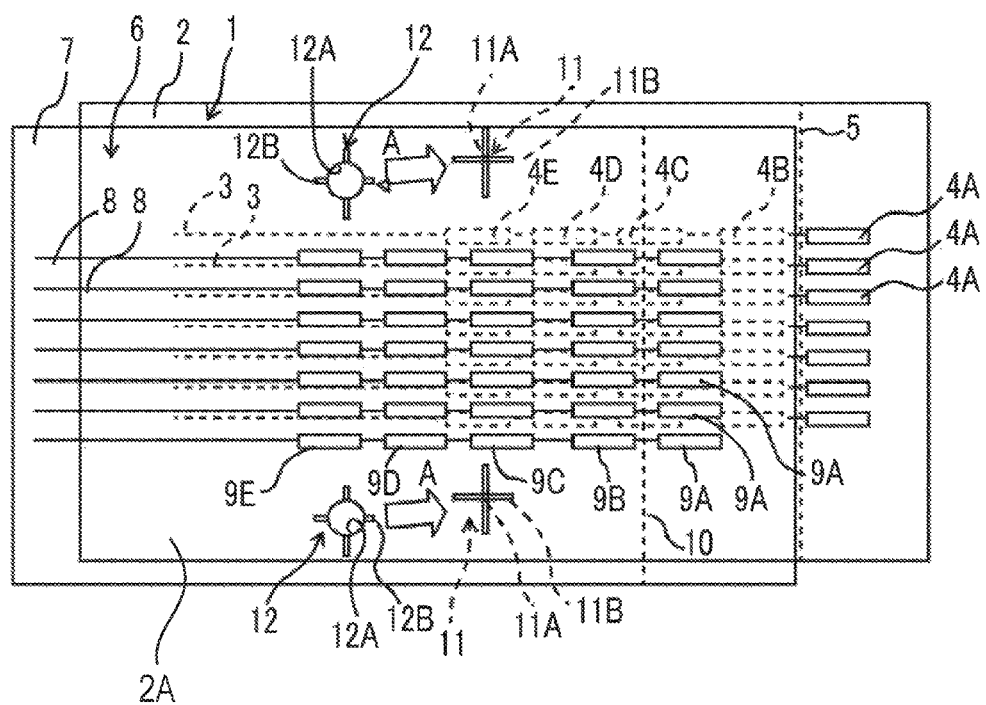
FIG. 1 is a plan view illustrating a flexible printed wiring substrate according to an embodiment of the present invention.
Figure 2:
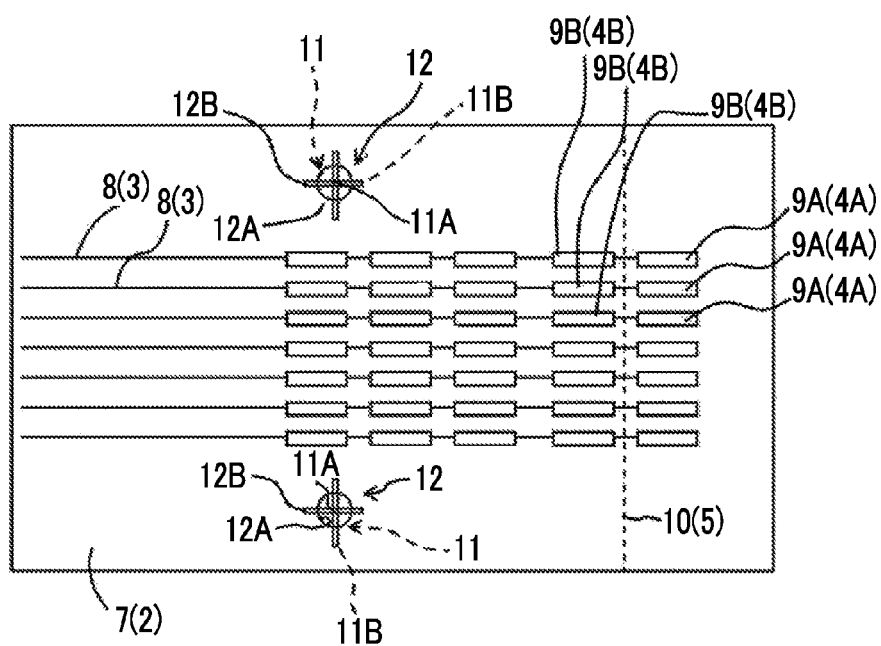
FIG. 2 is a plan view illustrating a state where two flexible printed wiring substrates are superimposed on each other.
Figure 3:
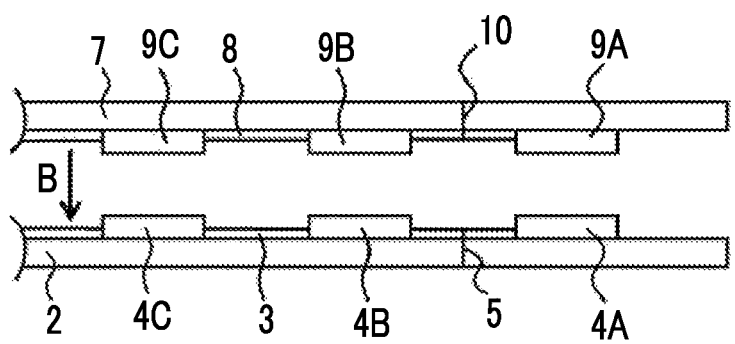
FIG. 3 is a partial cut-off side view illustrating a state where two flexible printed wiring substrates are superimposed on each other.

FIG. 1 is a plan view illustrating a state where two FPCs are superimposed on each other, FIG. 2 is a plan view illustrating a state where two FPCs are superimposed on each other, and FIG. 3 is a side view illustrating a states before two FPCs are superimposed on each other.

A first FPC 1 and a second FPC 6 are used for electrical connection means of electronic circuit components. The first FPC 1 includes a first substrate body 2, a plurality of first wiring portions 3 provided on the first substrate body 2 in parallel with each other, and a plurality of first connection terminal portions 4A, 4B, 4C, 4D, and 4E provided in each of the first wiring portions 3 at intervals.

The first substrate body 2 is provided with a first substrate cut-off portion 5 for cutting off the first wiring portion 3 between the first connection terminal portion 4A of a first row and the first connection terminal portion 4B of a second row and blocking electrical connection between each of the connection terminal portions 4A and 4B. The first substrate cut-off portion 5 is provided so as to extend linearly between the first connection terminal portion 4A of the first row and the first connection terminal portion 4B of the second row. The first substrate cut-off portion 5 in the first substrate body 2 is configured to be capable of being cut off using a cutting tool such as a cutter.

Meanwhile, when the first substrate cut-off portion 5 is provided with a cutting guide line, the first substrate body 2 can be simply cut off at a designated point.

In addition, when the first substrate cut-off portion 5 is provided with a folding line, the first substrate body 2 can be cut off so as to be torn manually along this folding line without using a cutting tool such as a cutter.

In the first substrate body 2, even after a used connection terminal portion 4A is cut off, it is possible to use unused connection terminal portions 4B, 4C, 4D, and 4E, and to reuse the first FPC 1.

Meanwhile, the first connection terminal portion 4A is provided on one side (right side in FIG. 1) of the first substrate body 2, and is provided with a mounting region 2A in which electronic circuit components (not shown) are mounted, on the other side (left side in FIG. 1) of the first substrate body 2. Therefore, even when the first substrate body 2 is cut off in the first substrate cut-off portion 5, the mounting state of electronic circuit components to be mounted is not influenced.

In addition, the second FPC 6 which is superimposed on the first FPC 1 includes a second substrate body 7, a plurality of second wiring portions 8 provided on the second substrate body 7 in parallel with each other, and a plurality of second connection terminal portions 9A, 9B, 9C, 9D, and 9E provided on each of the second wiring portions 8 at intervals.

Similarly to the first substrate body 2, the second substrate body 7 is also provided with a second substrate cut-off portion 10 for cutting off the second wiring portion 8 between the second connection terminal portion 9A of a first row and the second connection terminal portion 9B of a second row and blocking electrical connection between each of the connection terminal portions 9A and 9B. Similarly to the first substrate cut-off portion 5, the second substrate cut-off portion 10 is provided so as to extend between the second connection terminal portion 9A of the first row and the second connection terminal portion 9B of the second row. Similarly to the first substrate cut-off portion 5, the second substrate cut-off portion 10 in the second substrate body 7 is also configured to be capable of being cut off using a cutting tool such as a cutter.

Meanwhile, similarly to the first substrate cut-off portion 5, when the second substrate cut-off portion 10 is also provided with a cutting guide line serving as an index during the cutting off of the second substrate body 7, the second substrate body 7 can be simply cut off at a designated point together with the first substrate body 2.

In addition, when the second substrate cut-off portion 10 is provided with a folding line, the second substrate body 7 can be cut off so as to be torn, together with the first substrate body 2, manually along this folding line without using a cutting tool such as a cutter.

In the first substrate body 2, even after a used connection terminal portion 9A is cut off, it is possible to use an unused connection terminal portion 9B, and to reuse the second FPC 6.

Meanwhile, the second connection terminal portion 9A is provided on one side (right side in FIG. 1) of the second substrate body 7, and is provided with a mounting region 2A in which electronic circuit components (not shown) are mounted, on the other side (left side in FIG. 1) of the second substrate body 7. Therefore, even when the second substrate body 7 is cut off in the second substrate cut-off portion 10, the mounting state of electronic circuit components to be mounted is not influenced.

Two first mark portions 11 and 11 are formed so as to face each other in regions with the plurality of first wiring portions 3 interposed therebetween on the first substrate body 2 of the first FPC 1. The first mark portion 11 is formed in a cross shape, and includes a central portion 11A and four cross ends 11B. In addition, two second mark portions 12 are formed so as to face each other in regions with the plurality of second wiring portions 8 interposed therebetween on the second substrate body 7 of the second FPC 6. A circular hole portion 12A and four point portions 12B formed with intervals of 90 degrees on the outer circumferential portion of the hole portion 12A are formed in the second mark portion 12.

Next, a description will be given of a structure in which the first FPC 1 and the second FPC 6 are superimposed on each other, and the first connection terminal portion 4A and the second connection terminal portion 9A of the first row are electrically bonded to each other.

As shown in FIG. 1, the second substrate body 7 is moved on the first substrate body 2 so that the second mark portion 12 moves in the direction of arrow A in FIG. 1 and the second mark portion 12 overlaps the first mark portion 11. In this case, the second substrate body 7 is moved so that the hole portion 12A of the second mark portion 12 overlaps the central portion 11A of the first mark portion 11. Next, the four point portions 12B of the second mark portion 12 is superimposed on the cross ends 11B of the first mark portion 11.

As shown in FIG. 2, the second mark portion 12 is positioned with respect to the first mark portion 11, and the second substrate body 7 is moved in the direction of arrow B in FIG. 3 and is superimposed on the first substrate body 2. In this case, the first connection terminal portion 4A of the first row and the second connection terminal portion 9A of the first row are superimposed on each other. In addition, the first substrate cut-off portion 5 and the second substrate cut-off portion 10 are also superimposed on each other.

Next, the first connection terminal portion 4A of the first row and the second connection terminal portion 9A of the first row are electrically bonded to each other by thermocompression bonding or the like. In this case, the first connection terminal portions 4B, 4C, 4D, and 4E and the second connection terminal portions 9B, 9C, 9D, and 9E of other second row, third row, fourth row, and fifth row are not bonded to each other.

The first connection terminal portion 4A and the second connection terminal portion 9A of the present invention may be bonded to each other by a conductive adhesive, and may be bonded to each other by solder or the like. When the respective connection terminal portions 4A and 9A are electrically bonded, there is no limitation to the connection structure.

Electronic circuit components (not shown), for example, connected to the first wiring portion 3 on the first substrate body 2 and electronic circuit component (not shown), for example, connected to the second wiring portion 8 on the second substrate body 7 are electrically connected to each other by the bonding of the first connection terminal portion 4A to the second connection terminal portion 9A.

Figure 4:
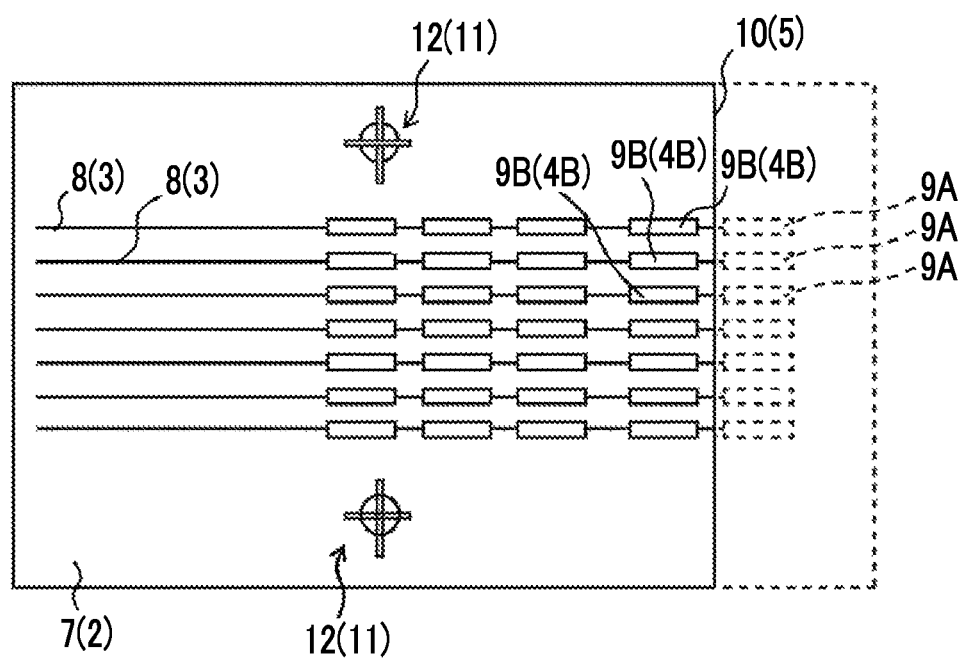
FIG. 4 is a plan view illustrating a state where two flexible printed wiring substrates are superimposed on each other and respective connection terminal portions are bonded to each other, and then unnecessary portions of respective substrate bodies are cut off.

When the first connection terminal portion 4A and the second connection terminal portion 9A are bonded to each other, and then the need to resolve this bonding state occurs due to an operation defect or the like of electronic circuit components, each of the substrate bodies 2 and 7 is cut off in the first substrate cut-off portion 5 and the second substrate cut-off portion 10, as shown by a broken line in FIG. 4. In each of the substrate bodies 2 and 7, the first connection terminal portion 4A and the second connection terminal portion 9B of the first row which are bonded to each other can be separated from the first connection terminal portion 4A and the second connection terminal portion 9B of the second row by this cutoff.

Even when a portion obtained by bonding the first connection terminal portion 4A and the second connection terminal portion 9A of the first row in each of the substrate bodies 2 and 7 is cut off, it is possible to use in bonding the first connection terminal portion 4B of the second row remaining in the first substrate body 2 to the second connection terminal portion 9B of the second row remaining in the second substrate body 7.

That is, in each of the substrate bodies 2 and 7, after a portion obtained by bonding the first connection terminal portion 4A and the second connection terminal portion 9A of the first row is cut off, the respective mark portions 11 and 12 are superimposed on each other again, and the first connection terminal portion 4B and the second connection terminal portion 9B of the second row which are unused are superimposed on each other. Thereby, the respective connection terminal portions 4B and 9B can be electrically bonded to each other by thermo-compression bonding or the like, and the respective electronic circuit components mounted in each of the substrate bodies 2 and 7 can be electrically connected to each other again.

Therefore, the first FPC 1 and the second FPC 6 can be reused as they are, without replacing the first FPC 1 and the second FPC 6 with new ones, and an increase in the cost of an electronic apparatus using the FPC can be avoid.

Meanwhile, when the first connection terminal portion 4B and the second connection terminal portion 9B of the second row are bonded to each other, and then a defect occurs in the operation of the mounted electronic circuit component again, each substrate cut-off portion is cut off which is provided between the first connection terminal portion 4B of the second row and the first connection terminal portion 4C of the third row in each of the substrate bodies 2 and 7, and between the second connection terminal portion 9B of the second row and the second connection terminal portion 9C of the third row. The first connection terminal portion 4C of the third row and the second connection terminal portion 9C of the third row can be bonded to each other again. Therefore, the first FPC 1 and the second FPC 6 can be reused as they are, without being replaced with new ones.

Meanwhile, each connection terminal portion of the fourth row and the fifth row in each of the FPCs 1 and 6 can also be used similarly to the above-mentioned bonding of the respective connection terminal portions of the third row.

Figure 5:
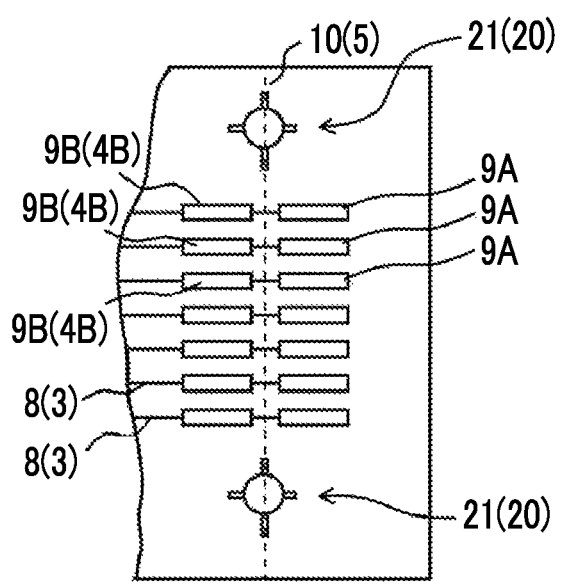
FIG. 5 is a partial cut-off plan view illustrating a flexible printed wiring substrate according to another embodiment of the present invention.

As shown in FIG. 5, a first mark portion 20 may be formed so as to face a region of the first substrate cut-off portion 5 of the first substrate body 2, and a second mark portion 21 may be formed so as to face a region of the second substrate cut-off portion 10 of the second substrate body 7. According to such a configuration, each of the mark portions 11 and 12 can be used in both a positioning mark of each of the connection terminal portions 4A and 9A and a cutting mark of each of the substrate bodies 2 and 7. Meanwhile, the configurations of the first mark portion 20 and the second mark portion 21 are the same as the configurations of the above-mentioned first mark portion 11 and the second mark portion 12, and thus the detail description thereof will not be given.

Figure 6:
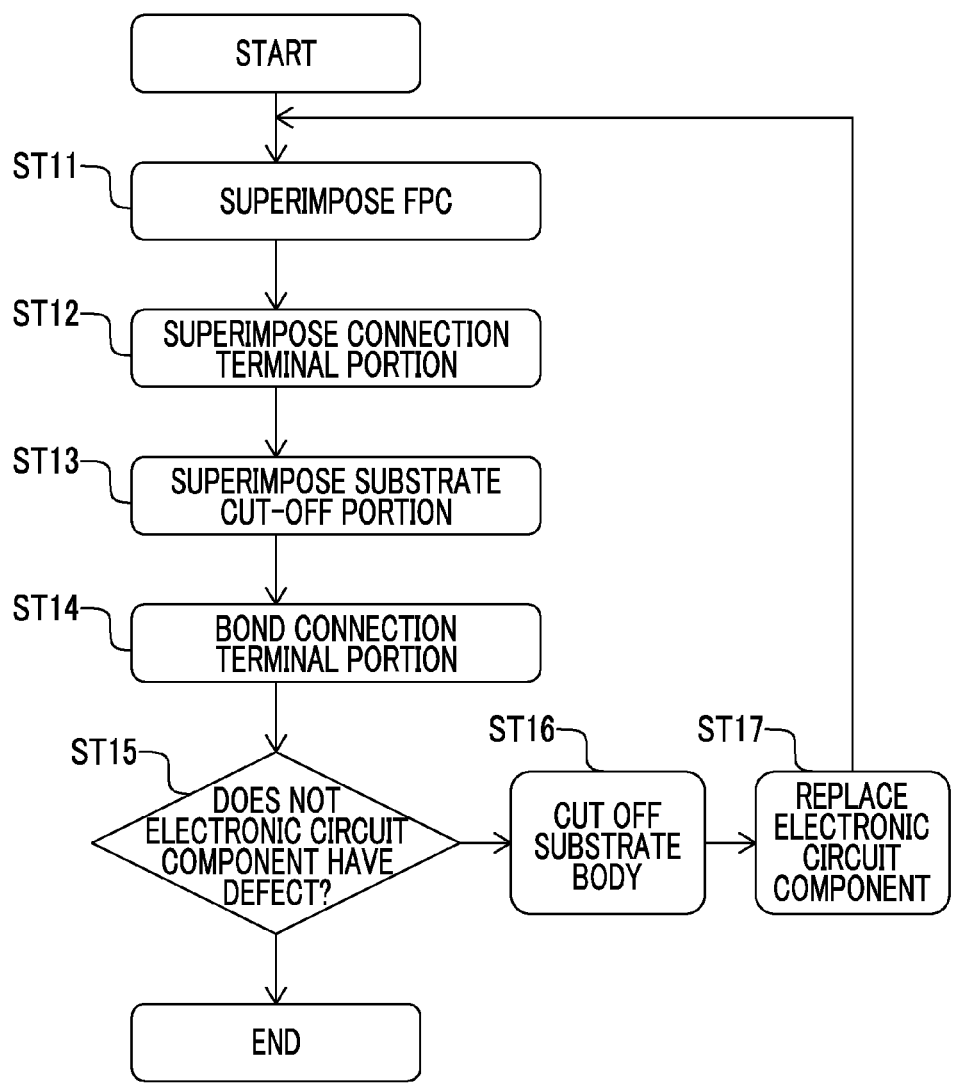
FIG. 6 is a flow diagram illustrating a method of connecting two flexible printed wiring substrates.

Next, a method of connecting the first FPC 1 and the second FPC 6 according to the present invention will be described with reference to a flow diagram shown in FIG. 6.

Step ST11

The first substrate body 2 of the first FPC 1 and the second substrate body 7 of the second FPC 6 are superimposed on each other.

Step ST12

The first connection terminal portion 4A of the first row for bonding among a plurality of first connection terminal portions 4A, 4B, 4C, 4D, and 4E which are provided in the first wiring portion 3, at intervals, provided on the first substrate body 2 is superimposed on the second connection terminal portion 9A of the first row for bonding among a plurality of second connection terminal portions 9A, 9B, 9C, 9D, and 9E which are provided on the second substrate body 7 of a second wiring substrate and are provided in the second wiring portion 8 at intervals.

Step ST13

The first substrate cut-off portion 5, provided between the respective first connection terminal portions 4A and 4B of the first substrate body 2, for cutting off electrical connection between the respective first connection terminal portions 4A and 4B by the cutoff of the first wiring portion 3 is superimposed on the second substrate cut-off portion 10, provided between the respective second connection terminal portions 9A and 9B of the second substrate body 7, for cutting off electrical connection between the respective second connection terminal portions 9A and 9B by the cutoff of the second wiring portion 8.

Step ST14

The first connection terminal portion 4A and the second connection terminal portion 9A superimposed in the process of superimposing the connection terminal portions in step ST13 are electrically bonded to each other by thermo-compression bonding or the like.

Step ST15

The presence or absence of a defect of the operation of electronic circuit components mounted in the first substrate body 2 and the second substrate body 7 is confirmed.

When a defect is not present in the operation of electronic circuit components, the bonding state of the respective connection terminal portions 4A and 9A in step ST14 is maintained.

Step ST16

When a defect is present in the operation of electronic circuit components in ST15, each of the substrate bodies 2 and 7 is cut off in each of the substrate cut-off portions 5 and 10, and the respective connection terminal portions 4A and 9A bonded in step ST14 are separated from each other in each of the substrate bodies 2 and 7.

Step ST17

Replacement with a new electronic circuit component is performed.

Returning back to step ST11 which is a process of superimposing the respective FPCs 1 and 6, the respective substrate bodies 2 and 7 of each of the FPCs 1 and 6 having a new electronic circuit component mounted therein are superimposed on each other again.

According to the above-mentioned method of connecting the first FPC 1 and the second FPC 6, after the respective connection terminal portions 4A and 9A are bonded to each other, unnecessary bonded portions are separated from each of the substrate bodies 2 and 7 in each of the substrate bodies 2 and 7. Thereafter, it is possible to bond unused connection terminal portions remaining in each of the substrate bodies 2 and 7, and to reuse each of the FPCs 1 and 6. Therefore, it is possible to suppress an increase in the cost of an electronic apparatus using the FPC.

In addition, even when each FPC is reused, it is possible to maintain a stable electrical connection state of each connection terminal portion.

The present invention is not limited to the aforementioned embodiment.

That is, those skilled in the art may variously change, combine, sub-combine, and substitute the components of the aforementioned embodiment within the technical scope of the present invention or its equivalents.

The present invention can be applied to various wiring substrates in a case of a wiring substrate used for the connection of electronic circuit components in a consumer electronic apparatus, an in-vehicle electronic apparatus, and the like.

It should be understood by those skilled in the art that various modifications, combinations, sub-combinations and alterations may occur depending on design requirements and other factors insofar as they are within the scope of the appended claims of the equivalents thereof.

What is claimed is:

1. A connection structure of wiring substrates, comprising:
   a first wiring substrate, including:
      a first substrate body;
      a first wiring portion provided on the first substrate body;
      a plurality of first connection terminal portions provided for the first wiring portion at intervals; and
      a first substrate cut-off portion provided between adjacent two of the plurality of first connection terminal portions, for cutting off electrical connection between the adjacent two first connection terminal portions; and
   a second wiring substrate provided so as to face the first wiring substrate, the second wiring substrate including:
      a second substrate body superimposed on the first substrate body;
      a second wiring portion provided on the second substrate body;
      a plurality of second connection terminal portions provided for the second wiring portion so as to be superimposed on the corresponding first connection terminal portions; and
      a second substrate cut-off portion superimposed on the first substrate cut-off portion, for cutting off electrical connection between adjacent two of the plurality of second connection terminal portions,
   wherein at least one of the first connection terminal portions and at least one of the second connection terminal portions are electrically bonded to each other.

2. The connection structure of wiring substrates according to claim 1, wherein the at least one first connection terminal portion and the at least one second connection terminal portion are electrically bonded to each other by compression.

3. A method of connecting first and second wiring substrates, the first wiring substrate including a first substrate body, a first wiring portion provided on the first substrate body, a plurality of first connection terminal portions provided for the first wiring portion at intervals, and a first substrate cut-off portion provided between adjacent two of the plurality of first connection terminal portions, and the second wiring substrate including a second substrate body, a second wiring portion provided on the first substrate body, a plurality of second connection terminal portions provided for the first wiring portion at intervals, and a second substrate cut-off portion provided between adjacent two of the plurality of second connection terminal portions, the method comprising:
   superimposing the first substrate body on a second substrate body;
   superimposing at least one of the first connection terminal portions for bonding on at least one of the second connection terminal portions for bonding;
   superimposing the first substrate cut-off portion on the second substrate cut-off portion;
   electrically bonding the at least one first connection terminal portion for bonding and the at least one second connection terminal portion for bonding which have been superimposed; and
   cutting the first and second substrate bodies in the first and second substrate cut-off portions, respectively, thereby separating the first connection terminal portion and the second connection terminal portion electrically bonded together from the respective first and second substrate bodies; and
   electrically bonding one of the remaining first connection terminal portions and one of the remaining second connection terminal portions which are not bonded to each other in the electrically bonding the first and second connection terminal portions.

4. The method of connecting wiring substrates according to claim 3, wherein the at least one first connection terminal portion and the at least one second connection terminal portion are electrically bonded to each other by compression.

5. The method of connecting wiring substrates according to claim 3, further comprising:
   providing a first mark portion at a corresponding position of the first substrate cut-off portion in the first substrate body, and providing a second mark portion at a corresponding position of the second substrate cut-off portion in the second substrate body; and
   superimposing the respective first connection terminal portions on the respective second connection terminal portions by superimposing the respective mark portions, and superimposing the first substrate cut-off portion on the second substrate cut-off portion.

* * * * *